United States Patent [19]

Harada et al.

[11] Patent Number: 5,725,753
[45] Date of Patent: Mar. 10, 1998

[54] APPARATUS AND METHOD FOR CLEANING SEMICONDUCTOR WAFERS

[75] Inventors: Yasuyuki Harada, Tokyo, Japan; Shigeyoshi Netsu, Kuala Lumpur, Malaysia

[73] Assignees: Pre-Tech Co., Ltd.; Shin-Etsu Handotai Co., Ltd., both of Tokyo, Japan

[21] Appl. No.: 638,233

[22] Filed: Apr. 26, 1996

[30] Foreign Application Priority Data

Apr. 28, 1995 [JP] Japan ................................ 7-106094
Oct. 11, 1995 [JP] Japan ................................ 7-292592

[51] Int. Cl.⁶ ..................................................... C02F 1/461
[52] U.S. Cl. ........................ 205/746; 205/748; 205/749; 205/766; 204/255; 204/253; 204/252; 134/1.3
[58] Field of Search ............................ 205/687, 746, 205/748, 749, 766; 204/255, 253, 252; 134/1.3

[56] References Cited

U.S. PATENT DOCUMENTS 5,543,030  8/1996  Shiramizu et al. ................ 205/464
5,578,193  11/1996  Aoki et al. ........................ 205/746

OTHER PUBLICATIONS

Patent Abstracts of Japan, vol. 14, No. 9 (E-870), (JP 1-255226) 10 Jan. 1989.
Patent Abstracts of Japan, vol. 7, No. 158 (E-186) [1303], (JP 58-66334) 12 Jul. 1983.
Patent Abstracts of Japan, vol. 18, No. 684 (E-1650), (JP 6-275592) 22 Dec. 1994.

*Primary Examiner*—Arun S. Phasge
*Attorney, Agent, or Firm*—Wenderoth, Lind & Ponack

[57] ABSTRACT

An improvement is proposed in the cleaning treatment of semiconductor silicon wafers in which the conventional step of cleaning with an aqueous solution of an alkali is replaced with a cleaning treatment with a temporarily alkaline pure water which is produced electrolytically by the application of a DC voltage between a cathode and an anode bonded to the surfaces of a hydrogen-ion exchange membrane so that the alkaline cleaning treatment can be performed under mild conditions so as to eliminate the troubles due to formation of COPs unavoidable in the conventional process. In addition, the pure water rinse following the alkali cleaning of the wafers before transfer to the succeeding acidic cleaning step can be omitted to greatly contribute to the improvement of productivity. The apparatus used therefor comprises a rectangular vessel divided into a central cathode compartment, in which the wafers are held in a vertical disposition within an up-flow of pure water, and a pair of anode compartments by partitioning with a pair of hydrogen-ion exchange membranes, on both sides of which a cathode plate and anode plate are bonded.

19 Claims, 8 Drawing Sheets

APPARATUS AND METHOD FOR CLEANING SEMICONDUCTOR WAFERS

BACKGROUND OF THE INVENTION

The present invention relates to an apparatus for cleaning semiconductor wafers and a method for cleaning semiconductor wafers by using the apparatus. More particularly, the invention relates to an apparatus for wet-process cleaning of semiconductor single crystal wafers such as silicon wafers capable of efficiently giving a very reliable cleaning effect in the manufacturing process thereof or in the manufacturing process of semiconductor devices using the wafers as a substrate as well as a method for cleaning semiconductor wafers by using the apparatus.

As is known, the degree of integration in various semiconductor devices is increasing year by year toward an extremely high density. Along with this trend, it is increasingly very important to keep a highly clean condition of the working environment for the manufacture of semiconductor devices and also to ensure high cleanness of the semiconductor wafers as the base material of semiconductor devices.

In this regard, it is an indispensable procedure that all of silicon wafers be subjected to a cleaning treatment with an object to remove any foreign materials including tiny particulate bodies called particles and contaminants such as metallic impurities, organic matters, surface films formed by spontaneous or natural oxidation and adsorption along with an additional effect of improving the planarity of the surface so as to eliminate troubles thereby and to increase the yield of acceptable products in the manufacturing process of semiconductor devices and to improve the reliability in the performance of the devices.

While various proposals and attempts have been made heretofore for the cleaning treatment of silicon wafers, the method most widely under practical applications is the so-called RCA cleaning method developed by W. Kern et al. of RCA Corporation, U.S.A., during 1960s. A typical sequence of this RCA method consists of two or three steps including the first step using an SC-1 (RCA Standard Clean-1) cleaning solution which is an aqueous solution of ammonia and hydrogen peroxide ($NH_4OH/H_2O_2/H_2O$) to remove particles and organic matters and the second step using an SC-2 cleaning solution which is an aqueous solution of hydrogen chloride and hydrogen peroxide ($HCl/H_2O_2/H_2O$) to remove metallic contaminants with optional intervention of an additional step between the SC-1 and SC-2 cleaning treatments using a DHF (diluted hydrogen fluoride) cleaning solution which is an aqueous solution of hydrogen fluoride ($HF/H_2O$) to remove the surface film formed by the SC-1 cleaning treatment. It is understood that the effectiveness of the above mentioned SC-1 cleaning solution in the RCA method for the removal of particles and organic matters is obtained by the etching activity of ammonia as an ingredient therein.

It is also known, on the other hand, that a single crystal rod of semiconductor silicon obtained by the Czochralski method inherently contains crystal defects called as-grown defects introduced in the course of the crystal growing process. When a silicon wafer containing such as-grown defects appearing on the surface is subjected to an etching treatment, the rate of etching is greater at or in the vicinity of the crystal defects than on the surface areas free from such crystal defects so that proceeding of etching is not uniform over the whole surface but selective on the areas containing the crystal defects unavoidably resulting in the formation of tiny cavities called "pits".

Occurrence of pits mentioned above on the surface of a silicon wafer causes a serious problem in the control of particles on the wafer surface in the cleaning treatment thereof. Since it is usual that the number of particles deposited on the wafer surface is counted with a particle counter which is an instrument to count the number of the bright spots due to the scattering light when the wafer surface is scanned with a laser beam, namely, the pits also act as the scattering sites for the laser beam and the particle counter detects the bright spots due to the pits as a positive bias over the number of true particles. The pit to cause an erroneous increment in the number of particles counted by a particle counter is called a COP (crystal-originated particle).

A problem accompanying the existence of COPs on the wafer surface is that the electric breakdown characteristic of the gate oxidized film on a semiconductor device may be subject to degradation thereby so that a countermeasure against generation of COPs on the wafer surface, which was considered as a rather insignificant problem in the prior art, must be taken into consideration as a very important problem to comply with the recent trend in the semiconductor technology toward a higher and higher density of integration of semiconductor devices.

The cleaning solutions used in the RCA cleaning method are also not free from several problems. For example, the SC-1 cleaning solution is generally ineffective for the removal of metallic impurities as compared with acidic cleaning solutions excepting for the metals forming a complex compound with ammonia such as copper. The SC-2 cleaning solution, on the other hand, has an excellent cleaning effect on metallic impurities though less effective on particles and organic matters. A problem in the use of the SC-2 cleaning solution is that the hydrogen peroxide contained therein has an oxidizing activity so that an oxidized surface film of silicon is formed thereby on the wafer surface and the effectiveness thereof is considered to be decreased when the concentration of metallic impurities is high.

It is of course that the cleaning method for silicon wafers by using the cleaning solutions as described above has a limitation in the applicability thereof because, in the cleaning work undertaken in the manufacturing process of semiconductor devices, for example, the cleaning solution may attack the parts such as circuit wirings made from metals such as aluminum exposed bare and dissolve away the metallic parts or the cleaning solution may infiltrate through interstices or pinholes to attack metallic parts embedded in interlayer films resulting in a serious problem of corrosion.

To summarize, each of the conventional cleaning methods including the RCA method as a typical one has problems that the procedure of the cleaning method using several different cleaning solutions in sequence is necessarily lengthy and troublesome necessitating use of a multistage cleaning apparatus for the respective cleaning solutions in addition to the problems inherent in the respective cleaning solutions due to the chemicals contained therein. Needless to say, the cleaning treatment of silicon wafers conducted in several sequential steps is disadvantageous not only in respect of the expensiveness due to the large investment for facilities and high running costs for labors and materials including chemicals and pure or deionized water but also in respect of the environmental pollution in connection with the waste water and depleted cleaning solutions discharged in large volumes out of the cleaning process. It is therefore a desirable approach to develop a cleaning method of semiconductor wafers in which the volume of cleaning solutions to be used can be minimized as far as possible or, if possible, to develop a method in which no cleaning solutions are used. Many proposals and attempts have been made heretofore in this direction.

For example, Japanese Patent Kokai 6-260480 discloses an apparatus and method for cleaning of silicon wafers, according to which an electrolytic vessel having two compartments as partitioned with a porous membrane is provided with a cathode rod and an anode rod in the respective compartments to produce hydroxyl ion ($OH^-$)-containing water and hydrogen ion ($H^+$)-containing water in the cathode and anode compartments, respectively, under continuous introduction of water containing an electrolyte to enhance the electrolytic efficiency into each of the cathode and anode compartments and the ion-containing effluents from the respective compartments are led to two treatment vessels installed separately, in which silicon wafers are subjected to the cleaning treatment.

While the cleaning treatment with the hydroxyl ion-containing water can be construed to be equivalent to the cleaning treatment with the SC-1 cleaning solution in the RCA method, the above mentioned Japanese patent document takes a position that the role played by the hydroxyl ions consists in the stabilization of the aluminum surface activated by the hydrogen ion treatment and removal of colloidal silica particles remaining on the surface after the process of polishing or planarization but is silent on the removal of particles in general for which the SC-1 cleaning solution is effective and on the positive merit thereby as a countermeasure against COPs of which the RCA method cannot provide any significant improvements.

According to the same Japanese patent document as mentioned above, the method involves several serious problems to be solved including the great danger due to the use of a very high direct-current voltage to be applied between the cathode and anode which is as high as $10^3$ to $10^4$ volts/cm and the difficulties encountered in preventing a decrease or in controlling the effective concentrations of the hydroxyl and hydrogen ions in the respective effluents coming out of the electrolytic vessel since the hydroxyl ions and hydrogen ions produced in the respective compartments are unstable ions so that the ion-containing water returns to neutral water in a while sometimes before the effluents reach the respective treatment vessels installed separately.

SUMMARY OF THE INVENTION

The present invention accordingly has an object to provide a novel and improved apparatus and an improved method for the cleaning treatment of semiconductor wafers using the apparatus by which the above described problems in the conventional apparatuses and methods can be solved to be freed from the disadvantages.

Thus, the apparatus of the present invention for the cleaning treatment of semiconductor wafers according to a first aspect of the invention comprises:
 (a) a rectangular vessel to contain an aqueous medium for cleaning of a semiconductor wafer by holding the semiconductor wafer as a workpiece in a substantially vertical disposition in the center part thereof, said rectangular vessel being partitioned in the lengthwise direction into a cathode compartment at the center and a pair of anode compartments on both sides of the cathode compartment;
 (b) a pair of partitions each partitioning the cathode compartment and one of the anode compartments, each partition being formed of a pair of hydrogen-ion exchange membranes, one facing the cathode compartment and the other facing the anode compartment to form a flow passage therebetween;
 (c) a pair of cathode plates each bonded to one of the ion exchange membranes on the surface facing the cathode compartment; and
 (d) a pair of anode plates each bonded to one of the ion exchange membranes on the surface facing the anode compartment at such a position approximately to oppose to the cathode plate.

The apparatus of the present invention for the cleaning treatment of semiconductor wafers according to a second aspect of the invention comprises:
 (a) a rectangular vessel to contain an aqueous medium for cleaning of a semiconductor wafer by holding the semiconductor wafer as a workpiece in a substantially vertical disposition in the center part thereof, said rectangular vessel being partitioned in the lengthwise direction into a cathode compartment at the center and a pair of anode compartments on both sides of the cathode compartment;
 (b) a pair of hydrogen-ion exchange membranes each partitioning the cathode compartment and one of the anode compartments;
 (c) a pair of cathode plates each bonded to one of the ion exchange membranes on the surface facing the cathode compartment; and
 (d) a pair of anode plates each bonded to one of the ion exchange membranes on the surface facing the anode compartment at such a position approximately to oppose the cathode plate.

It is preferable that, in each of the apparatuses defined above according to the first and second aspects of the invention, an ultrasonic transducer is provided on the bottom of the cathode compartment so that the efficiency of the cleaning treatment can be greatly improved by applying ultrasonic waves of a specified frequency to the cleaning medium in the cathode compartment.

The method of the present invention for the cleaning treatment of a semiconductor wafer by using the above defined apparatus of the invention comprises the steps off
 (a) holding a semiconductor wafer in the cathode compartment in a substantially vertical disposition;
 (b) introducing pure or deionized water into each of the cathode compartment, the anode compartments and, in the apparatus of the first aspect, the flow passages formed between a pair of ion exchange membranes continuously at the bottom thereof;
 (c) discharging the pure water continuously from the top of each of the cathode compartment, the anode compartments and, in the apparatus of the first aspect, the flow passages formed between a pair of ion exchange membranes;
 (d) applying a direct-current voltage between the cathode plate and the anode plate; and, optionally,
 (e) applying ultrasonic waves to the pure water in the cathode compartment.

DETAILED DESCRIPTION OF THE PREFERRED EMBODIMENTS

As is described above, the apparatuses of the invention for the cleaning treatment of semiconductor wafers in a variety of embodiments can be classified into those according to the first aspect of the invention and those according to the second aspect of the invention.

The inventive apparatus according to the first aspect of the invention comprises:

(a) a rectangular vessel to contain an aqueous medium for cleaning of a semiconductor wafer by holding the semiconductor wafer as a workpiece in a substantially vertical disposition in the center part thereof, said rectangular vessel being partitioned in the lengthwise direction into a cathode compartment at the center and a pair of anode compartments on both sides of the cathode compartment;

(b) a pair of partitions each partitioning the cathode compartment and one of the anode compartments, each partition being formed of a pair of hydrogen-ion exchange membranes, one facing the cathode compartment and the other facing the anode compartment, to form a flow passage therebetween;

(c) a pair of cathode plates each bonded to the ion exchange membrane on the surface facing the cathode compartment; and (d) a pair of anode plates each bonded to the ion exchange membrane on the surface facing the anode compartment at such a position approximately to oppose to the cathode plate, each of the cathode plates and anode plates having substantially identical area.

It is preferable that an ultrasonic transducer is provided on the bottom of the cathode compartment so that the efficiency of the cleaning treatment can be greatly improved by the application of ultrasonic waves of a specified frequency to the cleaning medium in the cathode compartment even with a great decrease in the direct-current voltage applied between the cathode plate and anode plate.

The inventive apparatus according to the second aspect of the invention comprises:

(a) a rectangular vessel to contain an aqueous medium for cleaning of a semiconductor wafer by holding the semiconductor wafer as a workpiece in a substantially vertical disposition in the center part thereof, said rectangular vessel being partitioned in the lengthwise direction into a cathode compartment at the center and a pair of anode compartments on both sides of the cathode compartment;

(b) a pair of hydrogen-ion exchange membranes each partitioning the cathode compartment and one of the anode compartments;

(c) a pair of cathode plates each bonded to the ion exchange membrane on the surface facing the cathode compartment; and (d) a pair of anode plates each bonded to the ion exchange membrane on the surface facing the anode compartment at such a position approximately to oppose to the cathode plate.

The apparatus according to the second aspect of the invention can also be equipped with an ultrasonic transducer on the bottom of the cathode compartment so that the efficiency of the cleaning treatment can be greatly improved by the application of ultrasonic waves to the cleaning medium in the cathode compartment even with a great decrease in the direct-current voltage applied between the cathode plate and anode plate.

It is advantageous that each of the cathode plates and anode plates in the above described embodiments of the inventive apparatus is a plate provided with a large number of perforations.

In a further advantageous embodiment of the inventive apparatus, a pair of hydroxyl-ion permeable membranes are installed in the cathode compartment each between one of the cathode plates and the space for holding the workpiece in the cathode compartment in such a fashion that a pair of cathode sub-compartments are formed between each hydroxyl-ion permeable membrane and the cathode plate on the hydrogen-ion exchange membrane.

The method of the present invention for the cleaning treatment of a semiconductor wafer using the apparatus according to the first aspect of the invention described above comprises the steps of:

(a) holding a semiconductor wafer in the cathode compartment in a substantially vertical disposition;

(b) introducing pure water into each of the cathode compartment, the anode compartments and the flow passages formed between a pair of ion exchange membranes continuously at the bottom thereof;

(c) discharging the pure water continuously from the top of each of the cathode compartment, the anode compartments and the flow passages formed between a pair of ion exchange membranes; and (d) applying a direct-current voltage between the cathode plate and the anode plate.

The method of the present invention for the cleaning treatment of a semiconductor wafer using the apparatus according to the second aspect of the invention described above comprises the steps of:

(a) holding a semiconductor wafer in the cathode compartment in a substantially vertical disposition;

(b) introducing pure water into each of the cathode compartment and anode compartments continuously at the bottom thereof;

(c) discharging the pure water continuously from the top of each of the cathode compartment and anode compartments; and (d) applying a direct-current voltage between the cathode plate and the anode plate.

In the following, the apparatus and method of the invention for the cleaning treatment of a semiconductor wafer are described in more detail by making reference to the accompanying drawing.

Figure 1A:
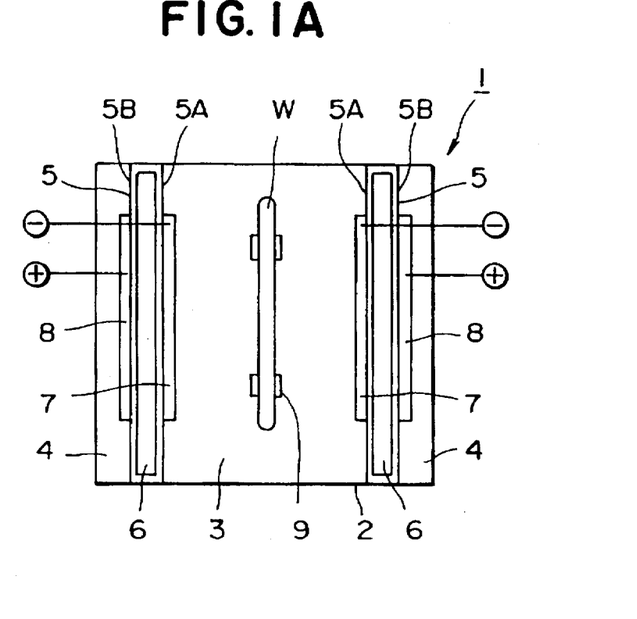
FIGS. 1A and 1B schematically illustrate a plan view and a side view, respectively, of the inventive apparatus according to the first aspect.
Figure 1B:
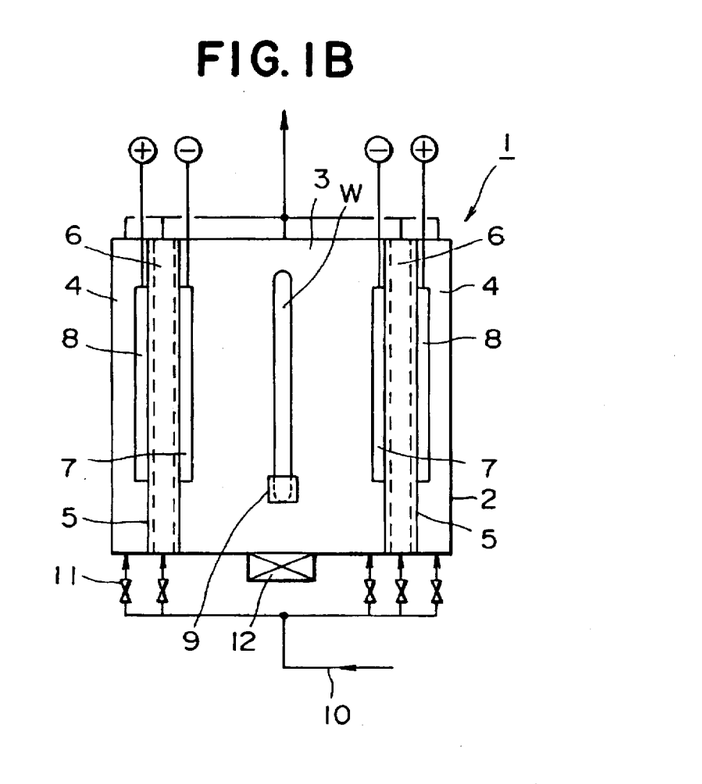

FIGS. 1A and 1B of the accompanying drawing schematically illustrate a plan view and a side view, respectively, of the inventive apparatus 1 according to the first aspect. The body 2 of the apparatus is an upwardly opening box-like vessel having the form of a rectangular parallelepipedon of which at least the inner surface layer is made from a material, which is absolutely free from leaching of any impurities into pure water in an ionized state, such as fused silica glass. It is of course optional that, when the body 2 is made from a material which may cause leaching of impurities, the inner surface thereof is lined with such a material free from the problem of impurity leaching.

The rectangular box-like vessel 2 of the apparatus 1 is partitioned into a cathode compartment 3 and a pair of anode compartments 4,4 on both sides of the cathode compartment 3 by means of a pair of partitions 5,5 each made of a pair of hydrogen-ion exchange membranes 5A,5B in an opposite and parallel disposition forming a flow passage 6 therebetween. In the embodiment illustrated in these figures, the ion exchange membranes 5A and 5B are integrated into the form of something like a card case with a thin space 6 inside. A pair of cathode plates 7,7 are bonded each to one of the hydrogen-ion exchange membranes 5A,5A on the surface facing the cathode compartment 3 in such a position of an approximately middle height of the vessel 2 to face a workpiece W held in the cathode compartment 3 with a holder 9. A pair of anode plates 8,8 are bonded each to one of the hydrogen-ion exchange membranes 5B,5B on the surface facing the respective anode compartments 4,4 at such an approximate position as to oppositely face the cathode plates 7,7.

The electrode plates, i.e. cathode plates 7,7 and anode plates 8,8, are made each from platinum or from a less expensive metal such as tantalum, titanium and the like with a plating layer of platinum and have a configuration close to the shape and dimensions of the workpiece W to be treated in the apparatus, though not particularly limitative.

A semiconductor wafer W as the workpiece to be subjected to a cleaning treatment in the inventive apparatus is held in a substantially vertical disposition in the center part of the cleaning vessel 2 or cathode compartment 3 by means of a cassette-less type holder or a clamping device 9 capable of holding the wafer W in point contact at the periphery of the wafer W. Although FIGS. 1A and 1B illustrate only a single wafer W held by the holder 9, it is of course that a plurality of wafers are held by means of a suitable holder so that the cleaning treatment of a number of wafers can be performed at one time. When a single wafer W is held in the cathode compartment 3 by a holder 9, it is not always necessary that the wafer W is in such a disposition that the flat surfaces thereof are in parallel to the cathode plates 7,7 but can be in a perpendicular or biased disposition relative to the cathode plates 7,7. When a plurality of wafers are subjected to the cleaning treatment at one time, on the other hand, it is preferable that the wafers are held in parallel each to the others keeping a space between adjacent wafers by means of a suitable holder capable of holding the wafers in point contact at the peripheries thereof and the holder is fixed in the cathode compartment 3 in such a direction that the flat surfaces of the wafers are perpendicular to the cathode plates 7,7.

As is illustrated in FIG. 1B, each of the cathode compartment 3, anode compartments 4,4 and flow passages 6,6 is connected at the bottom thereof to a branch of the pipeline 10 through a valve 11 for controlling the flow rate, through which pure water is introduced into the respective compartments and flow passages at a controlled rate. The cathode compartment 3, in which the wafers W are held for the cleaning treatment, is open at the top and the pure water continuously introduced thereinto at the bottom and rising therein is discharged at the top thereof as an effluent over an overflow weir (not shown in the figure). The pure water rising in the anode compartments 4,4 and flow passages 6,6 is collected in a pure-water tank (not shown in the figure) through a pipeline or as an effluent over the overflow weir for the cathode compartment 3 and re-used after purification in a pure-water regenerator (not shown in the figure). Though optional, an ultrasonic transducer 12 is installed at the bottom of the cathode compartment 3. Further, a pipeline (not shown in the figure) is installed to the cathode compartment 3 which serves to introduce ozone into the pure water in the cathode compartment 3.

In conducting the cleaning treatment of semiconductor wafers by using the above described apparatus, the wafer W is held by the holder 9 and placed at an appropriate position in the cathode compartment 3. Pure water is then introduced into each of the cathode compartment 3, anode compartments 4,4 and flow passages 6,6 from the pipeline 10 through the respective branches of the pipeline 10 and respective control valves 11 at a controlled flow rate. The pure water rising therein and reaching the top is discharged continuously through the pipelines for discharge installed at the top to be discarded or at least partly re-purified and collected in a pure water tank (not shown in the figure). While keeping the upward flow of pure water in the compartments and flow passages, the cathode plates 7,7 and the anode plates 8,8 are connected to a direct-current power source (not shown in the figure) so that an electrode reaction expressed by the equation:

$$2H_2O+2e^- \rightarrow H_2+2OH^-$$

takes place to form hydroxyl ions $OH^-$ in the pure water contained in the cathode compartment 3. The pure water thus containing the hydroxyl ions is temporarily alkaline and acts on the silicon wafer in a way similar to the effect in the alkaline cleaning treatment by the use of the so-called SC-1 cleaning solution. Different from conventional alkaline cleaning solutions containing an alkaline compound, the etching activity of the hydroxyl ion-containing pure water is very mild so that absolutely no COPs are formed by this alkaline cleaning treatment in the cathode compartment 3.

Though optional as is mentioned before, an ultrasonic transducer 12 is provided on the bottom of the cathode compartment 3 so that ultrasonic waves can be applied to the pure water in the cathode compartment 3. Although installation of an ultrasonic transducer in a vessel for cleaning of semiconductor wafers is known as a means to effect mechanical action for the removal of particles from the surface of the wafers, the significance of ultrasonic waves in the inventive apparatus and method is very unique and the ultrasonic waves exhibit a synergistic effect with the hydroxyl ions electrolytically formed in the pure water.

Figure 2:
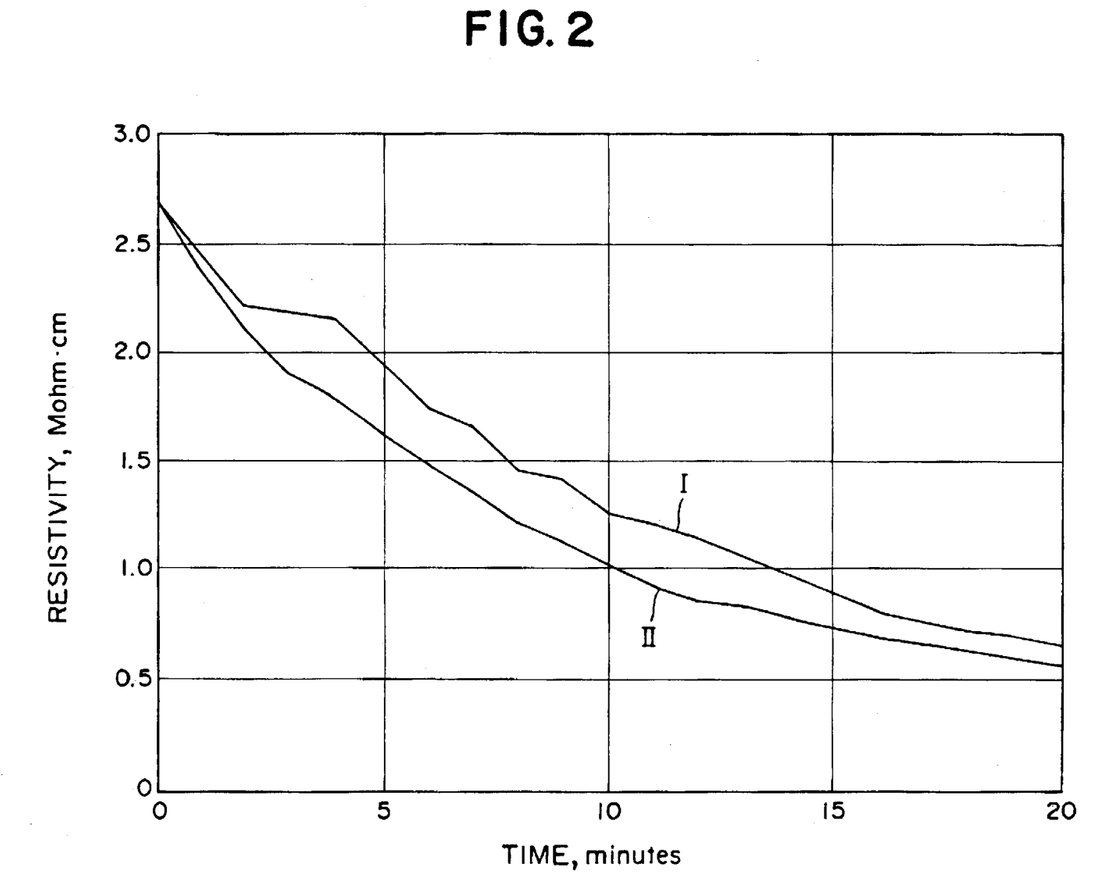
FIG. 2 is a graph showing resistivity of pure water in a field of ultrasonic waves of different frequencies as a function of duration for the application of ultrasonic waves.

Namely, FIG. 2 of the accompanying drawing is a graph showing the electric resistivity of pure water contained in the cathode compartment 3 under application of ultrasonic waves of different frequencies as a function of the length of time for the application of the ultrasonic waves, of which the curves I and II were obtained with application of ultrasonic waves at frequencies of 800 kHz and 3.0 MHz, respectively. As is clear from this graph, the resistivity of pure water is markedly decreased by the application of ultrasonic waves as the time for the ultrasonic application is extended and this effect is particularly remarkable when the ultrasonic frequency is 800 kHz or higher while the resistivity of pure water is decreased only slightly, presumably, due to absorption of carbon dioxide from the atmosphere in the absence of ultrasonic waves or even with application of ultrasonic waves of which the frequency is too low.

Though not well understood, the above mentioned phenomenon could be qualitatively interpreted in terms of the mechanochemical activity of ultrasonic waves on the water molecules to promote the free radical activity thereof and formation of certain ions. This means that a desired electrolytic current can be obtained at a relatively low electrolytic voltage, which otherwise is accompanied by a decrease in the hydroxyl ion concentration in the cathode compartment 3, as compared with that in the absence of ultrasonic waves. As a result, the efficiency for the removal of particles from the semiconductor wafer W can be synergistically increased by the combination of the mechanical and mechanochemical effects.

Each of the partitions 5,5 formed of a pair of hydrogen-ion exchange membranes 5A,5B with a flow passage 6 formed therebetween partitions the cathode compartment 3 and one of the anode compartments 4,4 and the hydrogen ions released from the membrane 5B into the pure water in the flow passage 6 are carried by the upflow of the pure water flowing through the flow passage 6 to be removed from the system so that the efficiency of the cleaning treatment can be increased so much even by the application of an otherwise impracticably low voltage between the electrodes.

In place of the partitions 5,5 illustrated in FIGS. 1A and 1B each consisting of a pair of ion exchange membranes 5A,5B, it is optional to use a pair of partitions each formed from a meshed bag made from plastic filaments and filled with beads of a cation exchange resin having a conventional particle size distribution and sandwiched between a cathode plate 7 and an anode plate 8 to be flattened in the form of a partition wall. In this case, the partitions are not provided with the flow passages and the resistance as an electrolytic vessel can be further decreased.

Figure 3A:
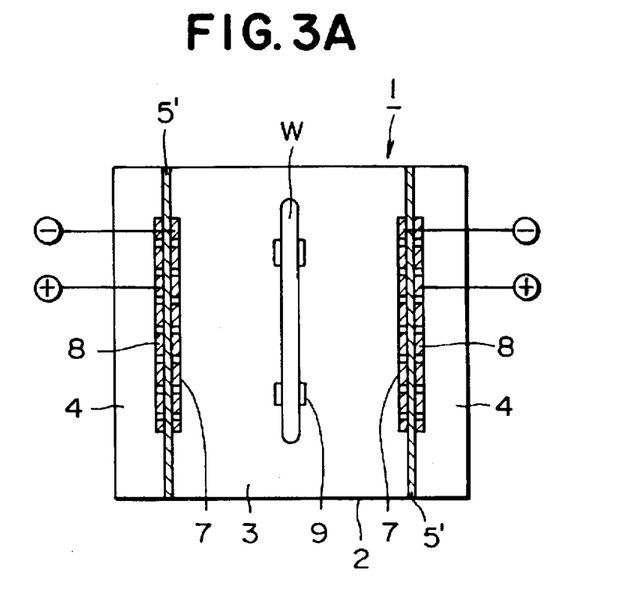
FIGS. 3A and 3B schematically illustrate a plan view and a side view, respectively, of the inventive apparatus according to the second aspect.
Figure 3B:
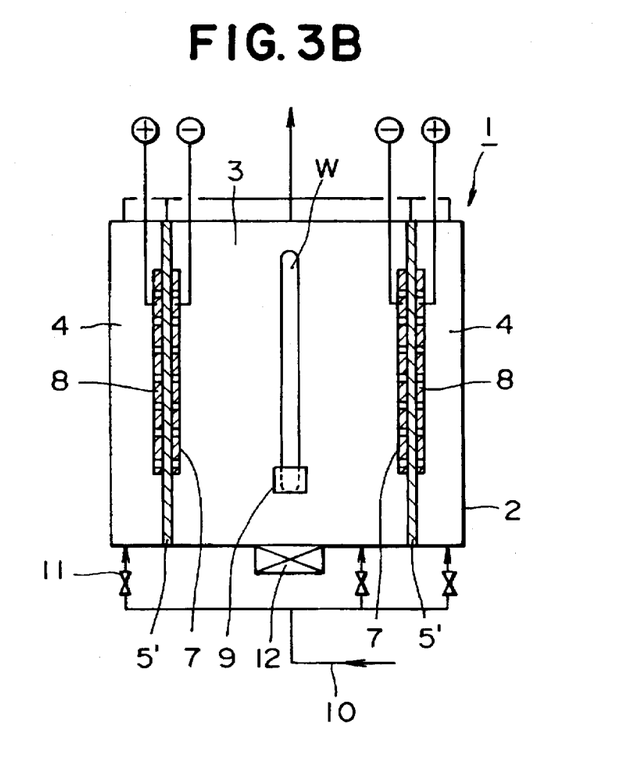

FIGS. 3A and 3B illustrate the inventive apparatus 1' according to the second aspect by a plan view and a side view, respectively, to give substantially the same cleaning effect as in the apparatus illustrated in FIGS. 1A and 1B, in which the rectangular vessel 2 is partitioned into a cathode compartment 3 and a pair of anode compartments 4,4 by a pair of partitions 5',5', each of which is made of a hydrogen-ion exchange membrane in the form of a single sheet in place of the partitions 5,5 in FIGS. 1A and 1B each of which is formed of a pair of ion exchange membranes 5A,5B forming a flow passage 6 therebetween. A pair of cathode plates 7,7 are bonded each to one of the partitions 5',5' on the surface facing the cathode compartment 3 while a pair of anode plates 8,8 are bonded each to one of the partitions 5',5' on the surface facing the anode compartment 4.

An additional advantage can be obtained in improving the efficiency of electrolysis of the pure water by the application of a direct-current voltage between the cathode plate 7 and anode plate 8 provided on the surfaces of the partition 5 or 5' thereby to increase the cleaning effect on the silicon wafers W when a large number of perforations are formed in these electrode plates. Though not particularly limitative, the perforations each have a diameter of 2 to 3 mm and are arranged to keep a distance of 2 to 3 mm from adjacent ones.

In conducting the cleaning treatment by applying a direct-current voltage between the electrode plates 7,8, the voltage should be adequately selected to give an appropriate electrolytic current with consideration of various factors such as the dimensions of the cleaning vessel, distance between the electrode plates depending on the size of the vessel, surface area of the electrode plates, characteristics of the ion exchange membranes, concentration of ions in water, safety in running and so on. When the problem of safety in running is taken as the first requisite, accordingly, it is possible to design the apparatus to work under application of a direct-current voltage in the range from 10 volts to several tens of volts with a current density of around 0.05 to 0.5 A/cm$^2$ to be free from serious safety problems.

Figure 4A:
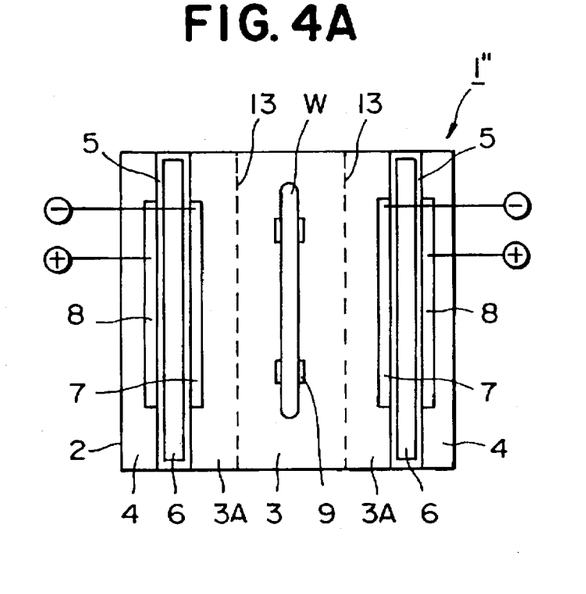
FIGS. 4A and 4B schematically illustrate a plan view and a side view, respectively, of the inventive apparatus illustrated in FIGS. 1A and 1B in which a hydroxyl-ion permeable membrane is installed between each of the cathode plates and the workpiece in the cathode compartment.
Figure 4B:
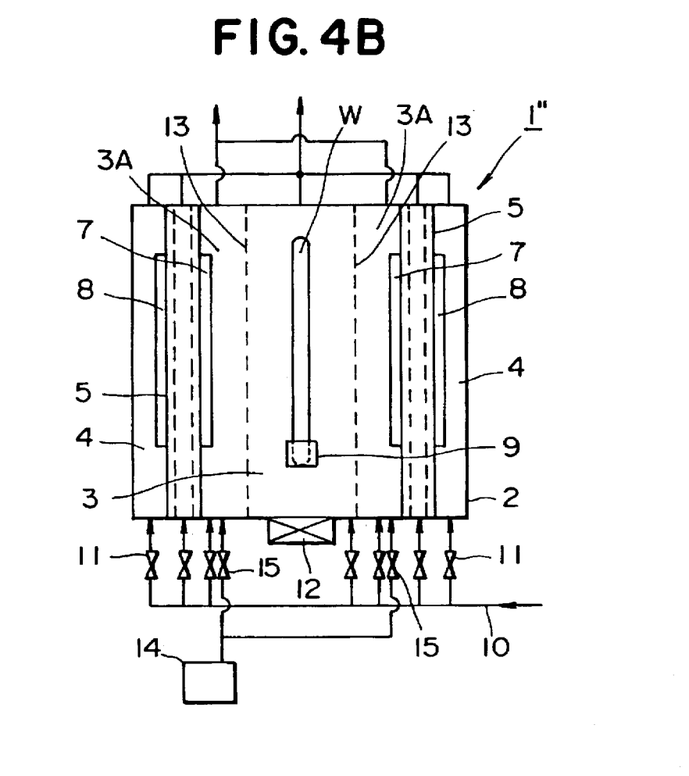

FIGS. 4A and 4B of the accompanying drawing illustrate a plan view and a side view, respectively, of another embodiment of the inventive apparatus 1" which is an improved modification of the apparatus 1 illustrated in FIGS. 1A and 1B. In this apparatus 1", the cathode compartment is further partitioned with a pair of ion-permeable membranes 13,13 capable of allowing permeation of anions including hydroxyl ions to form two sub-compartments 3A,3A each with one of the partitions 5,5 bearing the cathode plate 7 so as to isolate the space of the cathode compartment 3, in which semiconductor wafers for cleaning are held, from the cathode plate 7. Each of the sub-compartments 3A,3A is connected with a pipeline through a precision control valve 15 to a reservoir tank 14 containing an aqueous electrolyte solution. Otherwise, the structure of this improved apparatus 1" is the same as that of the apparatus 1 illustrated in FIGS. 1A and 1B. The procedure of the cleaning treatment therein is also the same as before excepting the flow of an electrolyte solution through the sub-compartments 3A,3A.

The hydroxyl ion-permeable membrane 13 is formed from a thin film of a cation exchange resin which can be the same as or similar to that forming the partitions 5,5. The aqueous electrolyte solution to flow upwardly through the sub-compartments 3A,3A is prepared by dissolving an alkaline compound such as sodium hydroxide, potassium hydroxide, ammonia and the like or a neutral salt containing no halogen atoms in pure water. Halogens should be avoided because these elements act as a very detrimental contaminant on a semiconductor silicon wafer. Though not particularly limitative, the concentration of the electrolyte in the aqueous solution flowing through the sub-compartments 3A,3A preferably should not exceed 1% by weight in view of the object of the cleaning treatment of semiconductor wafers by using pure water.

The aqueous electrolyte solution flowing through the sub-compartments 3A,3A serves to decrease the electric resistance in the cleaning vessel 1' so as to enable operation of the cleaning treatment with application of a further decreased direct-current voltage. When the electrolyte is an alkaline compound, the hydroxyl ions formed by the dissociation of the compound migrate into the cathode compartment 3 by permeating the hydroxyl-ion permeable membranes 13,13 so as to exhibit a cleaning effect on the wafers similar to the effect obtained in the treatment with a conventional alkaline cleaning solution.

It is further advantageous that the pure water introduced into the cathode compartment 3, in which the workpieces W are held, contains ozone introduced into the water in advance or by connecting the cathode compartment 3 to a pipeline (not shown in the figures), through which ozone can be introduced into the pure water in the cathode compartment 3, thereby to further increase the removing efficiency on the particles from the workpieces W. The concentration of ozone in the pure water flowing through the cathode compartment 3 is preferably in the range from 0.1 to 10 ppm by weight.

Figure 5:
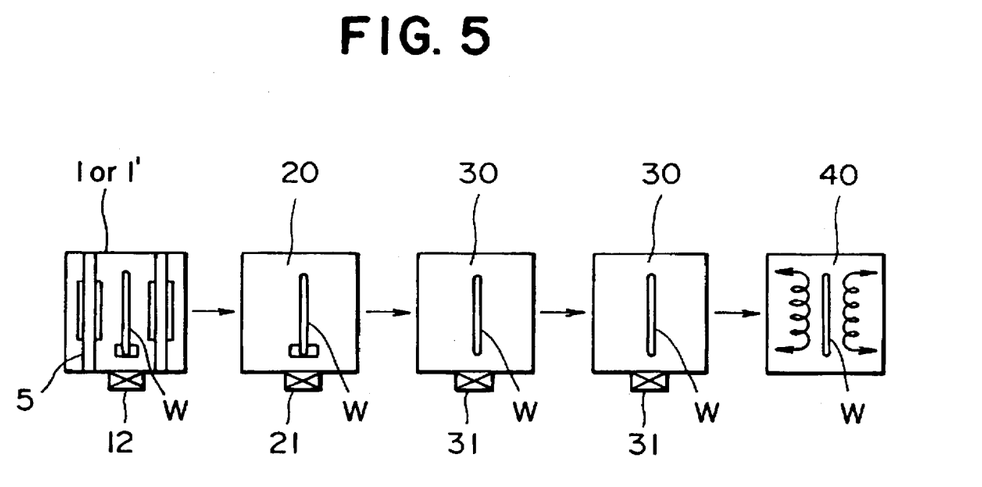
FIG. 5 is a schematic flow diagram showing the whole cleaning process using the inventive apparatus.

FIG. 5 is a schematic illustration of a typical flow diagram of the cleaning treatment of a semiconductor wafer using the apparatus 1 or 1' of the invention down to finishing by drying. The semiconductor wafer W after completion of the primary cleaning treatment in the inventive apparatus 1 or 1' is transferred into an acid cleaning apparatus 20 filled with an acidic aqueous cleaning solution containing from 0.1 to 10% by weight of hydrogen fluoride, from 1 to 10% by weight of hydrogen peroxide and an appropriate amount of a surface active agent under operation of an ultrasonic transducer 21 followed by a rinse treatment with pure water in several successive stages (two stages in FIG. 5) each in a rinse vessel 30 equipped with an ultrasonic transducer 31 and drying in a drying oven 40. The acidic cleaning solution filling the vessel 20 can be prepared most conveniently by diluting a commercial product of hydrofluoric acid already containing a surface active agent with water and adding an aqueous hydrogen peroxide solution.

As already mentioned, the treatment in the inventive apparatus 1 or 1' for the cleaning treatment of semiconductor wafers plays a role as a substitute for the conventional cleaning treatment using the SC-1 cleaning solution containing an alkaline reagent. In the acid cleaning step in the acid cleaning apparatus 20, the conventional SC-2 cleaning solution is replaced with another acidic solution containing hydrogen fluoride and hydrogen peroxside with further admixture of a surface active agent along with application of ultrasonic waves so that the efficiency of cleaning can be further enhanced. It is a remarkable advantage in the above described procedure that, while, in the conventional cleaning treatment by using the SC-1 and SC-2 cleaning solutions, rinse treatments of the workpieces with pure water in several stages are indispensable after the SC-1 cleaning step and before the SC-2 cleaning step, such a rinse treatment can be entirely omitted in the inventive cleaning process. Namely, the workpiece W after the treatment in the apparatus 1 or 1' can be transferred as such to the step of acid cleaning treatment in the vessel 20 and the rinse treatment is required only before the drying step in the drying oven 40.

The structure of the rinse vessels 30 is not particularly limitative and can be conventional. For example, the cleaning vessel 2 in the apparatus 1 or 1', from which the partitions 5,5 or 5',5' bearing the electrode plates 7,8 are removed, can be used satisfactorily. Although, as is illustrated in FIG. 5, each of the acid cleaning vessel 20 and rinse vessels 30,30 is equipped with an ultrasonic transducer 21 or 31 at the bottom, it is optional that the ultrasonic transducer 31 is omitted in one or more but not all of the rinse vessels 30, 30 when the rinse vessels 30,30 are installed in several stages. The drying oven 40 also can be conventional including IPA (isopropyl alcohol) vapor-phase drying systems, infrared drying ovens and the like.

The frequency of the ultrasonic waves generated by the ultrasonic transducers 12, 21, 31 provided at the bottom of the cleaning vessel 1 or 1', acid cleaning vessel 20 and rinse treatment vessels 30,30 is in the range from 500 kHz to 3 MHz but the frequency in the rinse treatment vessels 30,30 can be still lower down to 100 kHz.

In the following, the apparatus and the method for the cleaning treatment of semiconductor wafers are described in more detail by way of examples and comparative examples.

Examples 1—1 to 1-4

Comparative Examples 1—1 and 1-2

The workpieces to be subjected to a cleaning treatment in each of these experiments were each a mirror-polished undoped semiconductor silicon wafer of 150 mm diameter prepared by slicing an undoped semiconductor single crystal silicon rod grown by the floating zone-melting (FZ) method in consideration of the influences on the COPs by particle counting and on the impurity determination for the evaluation of the cleaning effect.

The apparatus for the cleaning test of the wafers was that illustrated in FIGS. 1A and 1B, of which the cathode compartment 3 was so wide that a group of 10 wafers W having a diameter of 150 mm can be simultaneously subjected to the cleaning treatment. The wafers W were held by point contact at three lower peripheral positions in a holder 9 at an upright and parallel disposition with a pitch of 6.5 mm and the holder 9 was set at about the middle position between the two opposite cathode plates 7,7, which were 210 mm apart, so that the flat surfaces of the wafers W were perpendicular to the surface of the cathode plates 7,7. Each of the flow passages 6,6 between a pair of ion exchange membranes 5A,5B and each of the anode compartments 4,4 had a width of 20

In Examples 1—1 to 1-4 and Comparative Example 1-2, pure water having a resistivity of about 2.5 Mohm.cm was introduced into each of the cathode compartment 3, anode compartments 4,4 and flow passages 6,6 from the pipeline 10 below at a specified flow rate by means of the control valves 1 1 while, in Comparative Example 1—1, in which no direct-current voltage was applied to the electrodes, an alkaline cleaning solution containing 5% by weight of ammonium hydroxide and 5% by weight of hydrogen peroxide was introduced into the cathode compartments 3 at the same flow rate as in the other experiments, pure water being introduced into each of the anode compartments 4,4 and flow passages 6,6. A direct-current voltage of 30 volts or 60 volts was applied in Example 1—1 and in Examples 1-2 to 1-4, respectively, between the cathode plate 7 and anode plate 8 and ultrasonic waves were applied in Examples 1-3 and 1-4.

Each of the silicon wafers W after the primary cleaning treatment in the above described manner was successively transferred to an acid cleaning vessel 20 and three stages of rinse treatment vessels 30 as is illustrated in FIG. 5 to be subjected to the acid cleaning treatment and three stages of rinse treatment with pure water, respectively, and finished by drying in an IPA vapor-phase drying system 40.

The thus cleaned and dried silicon wafers W were subjected to counting of particles with a particle counter (Model LS-6030, manufactured by Hitachi Electronics Engineering Co..) for the particles of a particle diameter of 0.18 μm or larger on the mirror-polished surface. The numbers of particles were averaged for the 10 wafers of the group after the cleaning treatment under the same conditions to give the results shown in Table 1 below.

TABLE 1

|  | DC voltage, volts | Ultrasonic frequency | Number of particles |
| --- | --- | --- | --- |
| Comparative Example 1-1 | — | — | 8300 |
| Comparative Example 1-2 | — | — | >10000 |
| Example 1-1 | 30 | — | 1550 |
| Example 1-2 | 60 | — | 1380 |
| Example 1-3 | 60 | 800 kHz | 496 |
| Example 1-4 | 60 | 1.5 MHz | 387 |

As is understood from the above given results, the cleaning treatment by using the inventive apparatus and according to the inventive method is so effective that the number of particles on a silicon wafer can be decreased to one fifth to sixth as compared with the alkaline cleaning treatment in Comparative Example 1—1. The improvement can be more remarkable when ultrasonic waves are applied to the cleaning medium in the cathode compartment 3 so that the number of particles can be decreased to one tenth to one twentieth.

Examples 2-1 to 2—4

Comparative Example 2

The experimental procedure for the cleaning treatment of 150 mm diameter mirror-polished silicon wafers was about the same as in the above described Examples and Comparative Examples excepting for the use of the apparatus illustrated in FIGS. 3A and 3B and modification of the treatment conditions as described below.

The cleaning vessel 2 of the apparatus 1' was made from fused silica glass. Each of the cathode plates 7,7 and the anode plates 8,8 was made from a thin plate of titanium which was perforated to have a large number of perforations of 2 mm diameter at a pitch of 3 mm followed by platinum plating. Two sheets of a hydrogen-ion exchange membrane (N-117/$H^+$, a product by Du Pont Co.) were each integrally sandwiched between the above prepared perforated and platinum-plated titanium plates, which served, one, as the cathode plate 7 and, the other, as the anode plate 8, to obtain a pair of electrode plate-bearing ion exchange membranes with which the cleaning vessel 2 was partitioned into a cathode compartment 3 and a pair of anode compartments 4,4 on both sides of the cathode compartment 3. The distance between the oppositely facing cathode plates 7,7 was 240 mm.

While keeping a flow of pure water having a resistivity of 2.5 Mohm.cm through each of the cathode compartment 3 and anode compartments 4,4, a direct-current voltage of up to 14.1 volts was applied between the cathode plate 7 and anode plate 8 to find that electrolytic currents therebetween of 40 A, 50 A, 60 A and 80 A were obtained with the DC voltages of 9.6 volts, 11.0 volts, 12.1 volts and 14.1 volts, respectively. Evolution of hydrogen gas and oxygen gas was noted on the surface of the respective electrode plates and the pH value of the water in the cathode compartment 3 was increased to 8 to 9. The oxidation-reduction potential (ORP) was decreased to −165 mvolts at the largest.

Five wafers as a group were subjected to a cleaning treatment in the above described apparatus. The specific conditions relative to the cathode compartment 3 for each particular experiment were as follows. The wafers were selected from those having at least 20000 particles deposited on the mirror-polished surface.

Figure 6:
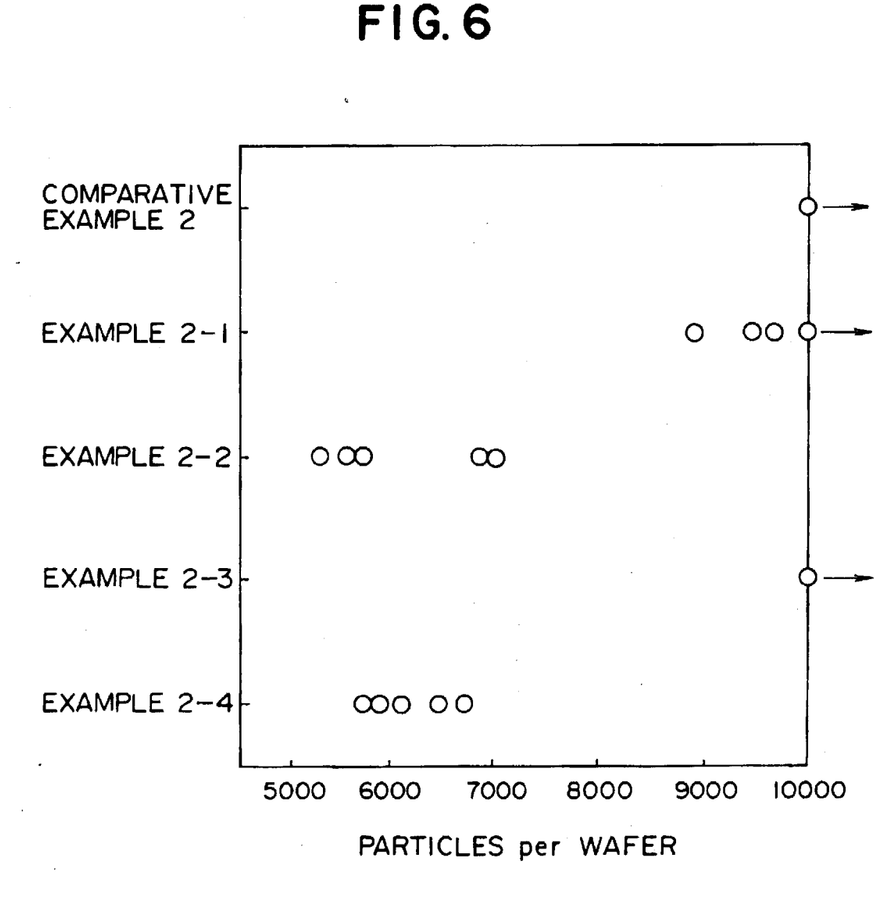
FIG. 6 is a dispersion diagram showing the number of particles on a silicon wafer after a cleaning treatment according to the invention under different conditions.

Example 2-1: application of 9.6 volts for a current of about 60 A without application of ultrasonic waves Example 2—2: application of 11.0 volts for a current of about 60 A with application of ultrasonic waves of 800 kHz Example 2-3: application of 12.1 volts for a current of about 60 A without application of ultrasonic waves and with admixture of the hydroxyl-ion water in the cathode compartment with 200 ppm of ammonium hydroxide Example 2-4: application of 14.1 volts for a current of about 60 A with application of 800 kHz ultrasonic waves and admixture of the hydroxyl-ion water in the cathode compartment with 200 ppm of ammonium hydroxide Comparative Example 2: without application of DC voltage and ultrasonic waves The results are summarized in FIG. 6 which is a dispersion diagram showing the number of particles on each wafer in Examples 2-1 to 2-4 and Comparative Example 2. In Example 2-3 and Comparative Example 2, the number of particles exceeded 10000 on every wafer while, in Example 2-1, the number of particles on three of the five wafers was less than 10000 and the decrease in the number of particles was still more remarkable in Examples 2—2 and 2-4 in which ultrasonic waves were applied to the hydroxyl ion-containing water in the cathode compartment 3.

Figure 7:
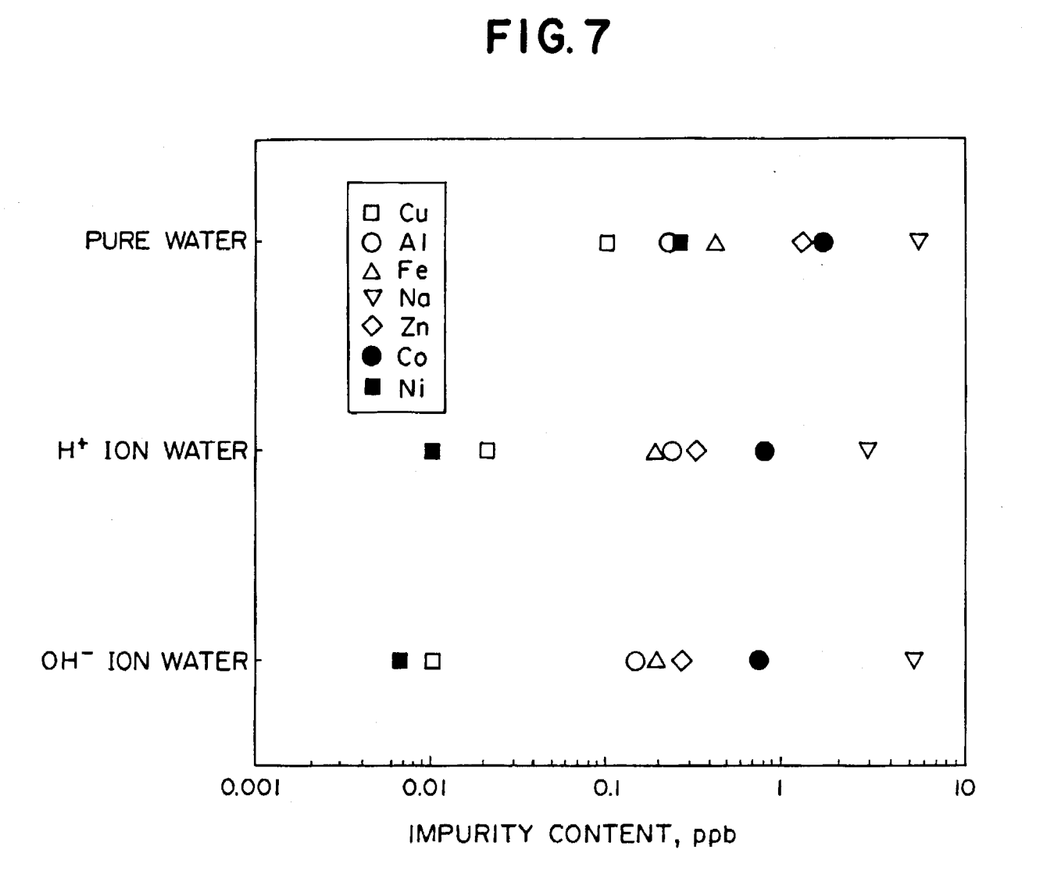
FIG. 7 is a diagram showing the concentrations of various kinds of metallic impurities in the starting pure water, in the hydrogen ion-containing water taken from the anode compartment and the hydroxyl ion-containing water taken from the cathode compartment in the inventive apparatus.

As a further test for reference, analysis to determine the content of metallic impurities was conducted for the pure water flowing through the cathode compartment 3 without application of a direct-current voltage, the hydroxyl ion-containing water taken from the cathode compartment 3 with application of a direct-current voltage of 12 volts and ultrasonic waves of 800 kHz frequency and the hydrogen ion-containing water taken from the anode compartment 4 with application of a direct-current voltage between the electrode plates to give the results shown in FIG. 7.

Examples 3-1 to 3—3

Comparative Example 3

With an object to determine the effect of temperature in the cleaning treatment, cleaning treatments were performed each for a single mirror-polished semiconductor silicon wafer contaminated with particles deposited thereon by using the same cleaning apparatus as used in Example 2 at a varied temperature of 30° C., 40° C., 50° C., 60° C. or 70° C. in about the same manner as in Example 2 excepting following conditions in each of these experiments. In Example 3—3 and Comparative Example 3, ozone was generated separately in an ozone generator and blown into the pure water introduced into the cleaning vessel 2.

Example 3-1: hydroxyl ion-containing water only

Example 3-2: hydroxyl ion-containing water, ultrasonic waves applied

Figure 8:
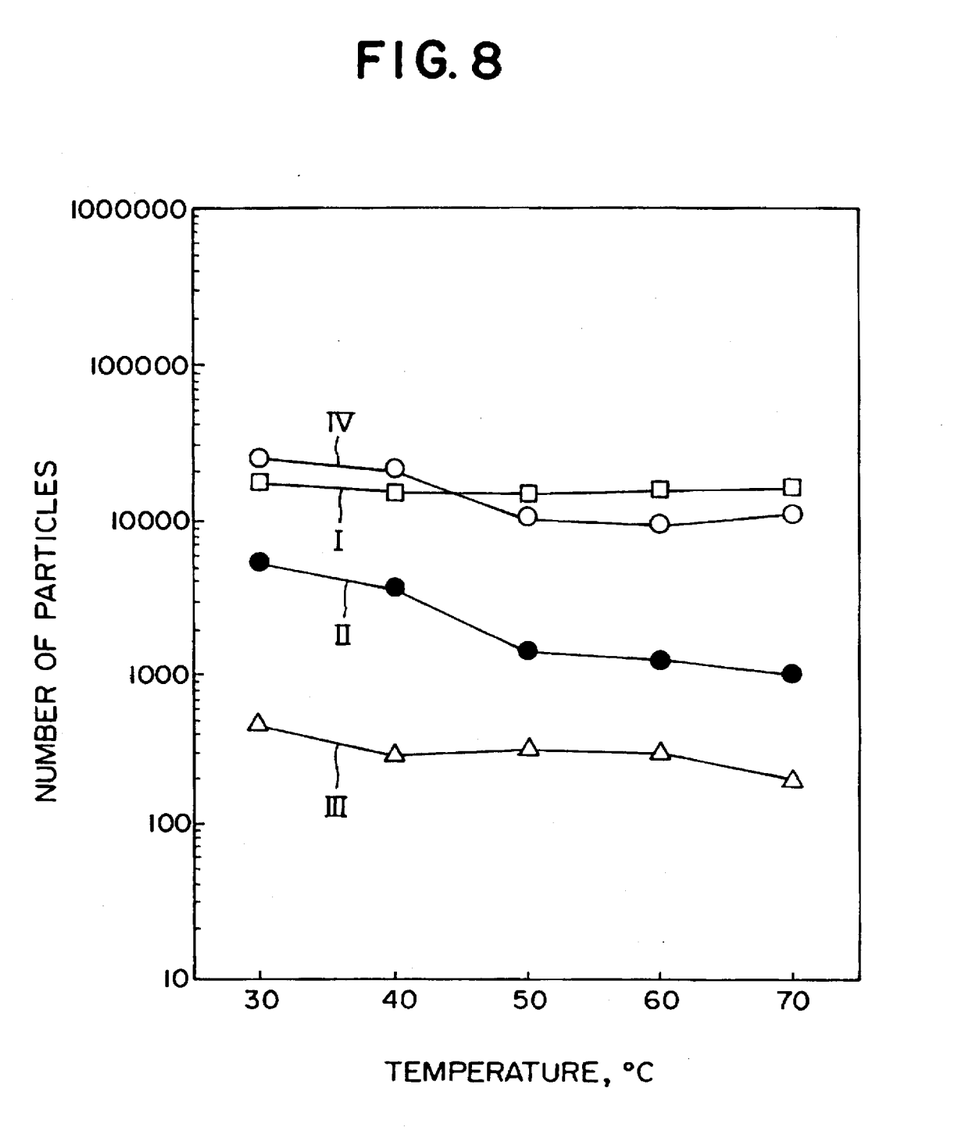
FIG. 8 is a graph showing the number of particles on a silicon wafer after a cleaning treatment at different temperatures according to the invention under different conditions.

Example 3—3: hydroxyl ion-containing water containing 2 ppm of ozone, ultrasonic waves applied Comparative Example 3: with pure water containing 2 ppm of ozone, no DC voltage applied The number of particles remaining on the mirror-polished surface of the respective wafers was counted with a particle counter to give the results shown in FIG. 8, in which the curves I, II, III and IV are for Examples 3-1 to 3—3 and Comparative Example 3, respectively. As is clear from this figure, no remarkable difference could be found between Example 3-1 and Comparative Example 3 but a great improvement could be obtained by the application of ultrasonic waves and the improvement was still greater by the combined use of ozone and ultrasonic waves. The influence of cleaning temperature was generally of no great significance.

Examples 4-1 to 4—4

Comparative Examples 4-1 and 4-2

The cleaning apparatus used here was that illustrated in FIGS. 4A and 4B, in which the distance between the cathode plates 7,7 was 210 mm and the distance between one of the cathode plates 7 and the corresponding ion-permeable membrane 13 to form a sub-compartment 3A was 20 mm giving a cathode compartment 3 of about 170 mm width. The conditions of the cleaning treatment was substantially the same as in Example 1 excepting introduction of a 0.5% by weight aqueous solution of sodium hydroxide into each of the sub-compartments 3A,3A. Pure water of the same resistivity as in Example 1 was introduced into the cathode compartment 3 in each of Examples 4-1 to 4—4 and Comparative Example 4-2 while the same alkaline cleaning solution as used in Comparative Example 1—1 was introduced into the cathode compartment 3 in Comparative Example 4-1. The results obtained in these cleaning tests are shown in Table 2 below.

TABLE 2

|  | DC voltage, volts | Ultrasonic frequency | Number of particles |
|---|---|---|---|
| Comparative Example 4-1 | — | — | 9400 |
| Comparative Example 4-2 | — | — | >10000 |
| Example 4-1 | 30 | — | 1270 |
| Example 4-2 | 50 | — | 1226 |
| Example 4-3 | 50 | 800 kHz | 351 |
| Example 4-4 | 50 | 1.5 MHz | 368 |

Examples 5-1 to 5-4

Comparative Examples 5-1 to 5-4

A cleaning process was conducted according to the flow diagram schematically illustrated in FIG. 5 through a series of apparatuses consisting of the primary cleaning apparatus 1 and an acid cleaning apparatus 20 for the secondary cleaning treatment followed by three stages of rinse treatment apparatuses 30,30,30 and drying oven 40. The cleaning solution introduced into the acid cleaning apparatus 20 in each test excepting Comparative Example 5-1, where pure water alone was used, was an acidic cleaning solution containing 5% by weight of hydrogen fluoride and 5% by weight of hydrogen peroxide. The acidic cleaning solution used in Examples 5-1 to 5-4 and Comparative Example 5-4 contained a surface active agent while no surface active agent was contained in the acidic cleaning solution used in Comparative Examples 5-1 to 5-3. Ultrasonic waves were applied to the acidic cleaning solution in Examples 5-1 to 5-4 and Comparative Examples 5-1 and 5-3 by running the ultrasonic transducer 21 on the bottom of the acid cleaning vessel 20, where the ultrasonic frequency was 400 kHz, 800 kHz, 1.5 MHz and 3.0 MHz in Examples 5-1 to 5-4, respectively.

Five a group of semiconductor single crystal silicon wafers were prepared by a primary cleaning treatment under the same conditions as in Example 1–3 followed by a rinse treatment with pure water and drying and subjected to the secondary acidic cleaning treatment under varied conditions followed by three stages of rinse treatment and IPA drying. The thus cleaned wafers were subjected to the determination of metallic impurity density for aluminum, copper and iron by the ICP mass-spectrometric analysis of the washing solution obtained by washing the mirror-polished surface of the wafers with a diluted hydrofluoric acid. The results are shown in Table 3 below as the average values for the five wafers. As a control, five a group of the silicon wafers before the secondary acid cleaning treatment were subjected to the determination of the metallic impurity density on the surface in the same manner as above to give the results concurrently shown in Table 3. The average densities of the respective metallic impurities on the wafer surface after the primary cleaning treatment were $24 \times 10^{10}$, $1.2 \times 10^{10}$ and $50 \times 10^{10}$ atoms/cm$^2$ for aluminum, copper and iron, respectively.

As is demonstrated by the above given Examples and Comparative Examples, the alkaline cleaning solution indispensable in the conventional cleaning treatment can be replaced with a mere pure water in an electrolyzed state so that not only the costs due to the use of an alkaline reagent and for the disposal of alkaline waste solutions can be saved but also formation of crystal defects such as COPs unavoidable in the prior art due to the use of an alkaline cleaning solution can be avoided. Moreover, the rinse treatment with pure water necessarily undertaken in the prior art in several stages between the alkaline cleaning treatment and acidic cleaning treatment can be entirely omitted so that the volume of the waste solutions to be disposed can be greatly decreased.

TABLE 3

| | After acid cleaning, × 10 atoms/cm$^2$ | | |
|---|---|---|---|
| Contaminant | Al | Cu | Fe |
| Comparative Example 5-1 | 25 | 0.56 | 20 |
| Comparative Example 5-2 | 29 | 0.95 | 10 |
| Comparative Example 5-3 | 19 | 0.63 | 8.7 |
| Comparative Example 5-4 | 35 | 0.49 | 1.9 |
| Example 5-1 | N.D. | 0.021 | N.D. |
| Example 5-2 | N.D. | N.D. | N.D. |
| Example 5-3 | N.D. | N.D. | N.D. |
| Example 5-4 | N.D. | N.D. | N.D. |

N.D.: not detected (<10$^8$ atoms/cm$^2$).

What is claimed is:

1. An apparatus for the cleaning treatment of a semiconductor wafer which comprises:

(a) a rectangular or square vessel for containing an aqueous medium for cleaning of a semiconductor wafer by holding the semiconductor wafer in a workpiece holder in a substantially vertical disposition in a center part thereof, said vessel being partitioned in the lengthwise direction into a cathode compartment at the center and a pair of anode compartments on both sides of the cathode compartment;

(b) a pair of partitions each partitioning the cathode compartment and one of the anode compartments, each partition being formed of a pair of hydrogen-ion exchange membranes, one, facing the cathode compartment and, the other, facing the anode compartment, to form a flow passage therebetween;

(c) a pair of cathode plates each bonded to one of the ion exchange membranes on the surface facing the cathode compartment; and (d) a pair of anode plates each bonded to one of the ion exchange membranes on the surface facing the anode compartment at such a position approximately to oppose to the cathode plate.

2. The apparatus for the cleaning treatment of a semiconductor wafer as claimed in claim 1 which further comprises an ultrasonic transducer on the bottom of the cathode compartment.

3. The apparatus for the cleaning treatment of a semiconductor wafer as claimed in claim 1 in which each of the cathode plates and anode plates has perforations.

4. The apparatus for the cleaning treatment of a semiconductor wafer as claimed in claim 1 in which the cathode compartment is partitioned with a pair of hydroxyl ion-permeable membranes each forming a sub-compartment between the cathode compartment and one of the partitions.

5. The apparatus for the cleaning treatment of a semiconductor wafer as claimed in claim 4 in which the cathode compartment is partitioned with a pair of hydroxyl ion-permeable membranes each forming a sub-compartment between the cathode compartment and one of the hydrogen-ion exchange membranes.

6. An apparatus for the cleaning treatment of a semiconductor wafer which comprises:
  (a) a rectangular or square vessel for containing an aqueous medium for cleaning of a semiconductor wafer by holding the semiconductor wafer in a workpiece holder in a substantially vertical disposition in a center part thereof, said vessel being partitioned in the lengthwise direction into a cathode compartment at the center and a pair of anode compartments on both sides of the cathode compartment;
  (b) a pair of hydrogen-ion exchange membranes each partitioning the cathode compartment and one of the anode compartments;
  (c) a pair of cathode plates each bonded to one of the ion exchange membranes on the surface facing the cathode compartment; and
  (d) a pair of anode plates each bonded to one of the ion exchange membranes on the surface facing the anode compartment at such a position approximately to oppose to the cathode plate.

7. The apparatus for the cleaning treatment of a semiconductor wafer as claimed in claim 6 which further comprises an ultrasonic transducer on the bottom of the cathode compartment.

8. The apparatus for the cleaning treatment of a semiconductor wafer as claimed in claim 6 in which each of the cathode plates and anode plates has perforations.

9. A method for the cleaning treatment of a semiconductor wafer in an apparatus comprising:
  (a) a rectangular or square vessel for containing an aqueous medium for cleaning of a semiconductor wafer by holding the semiconductor wafer in a workpiece holder in a substantially vertical disposition in a center part thereof, said vessel being partitioned in the lengthwise direction into a cathode compartment at the center and a pair of anode compartments on both sides of the cathode compartment;
  (b) a pair of partitions each partitioning the cathode compartment and one of the anode compartments, each partition being formed of a pair of hydrogen-ion exchange membranes, one, facing the cathode compartment and, the other, facing the anode compartment, to form a flow passage therebetween;
  (c) a pair of cathode plates each bonded to one of the ion exchange membranes on the surface facing the cathode compartment; and
  (d) a pair of anode plates each bonded to one of the ion exchange membranes on the surface facing the anode compartment at such a position approximately to oppose to the cathode plate, which method comprises the steps of:
    (A) holding a semiconductor wafer in the cathode compartment in a substantially vertical disposition;
    (B) introducing pure water continuously into each of the cathode compartment, anode compartments and flow passages at the bottom thereof;
    (C) discharging the pure water continuously from each of the cathode compartment, anode compartments and flow passages at the top thereof; and
    (D) applying a direct-current voltage between the cathode plates and the anode plates.

10. The method for the cleaning treatment of a semiconductor wafer as claimed in claim 9 in which ultrasonic waves are applied to the pure water in the cathode compartment.

11. The method for the cleaning treatment of a semiconductor wafer as claimed in claim 10 in which the frequency of the ultrasonic waves is in the range from 500 kHz to 3 MHz.

12. A method for the cleaning treatment of a semiconductor wafer in an apparatus comprising:
  (a) a rectangular or square vessel for containing an aqueous medium for cleaning of a semiconductor wafer by holding the semiconductor wafer in a workpiece holder in a substantially vertical disposition in a center part thereof, said vessel being partitioned in the lengthwise direction into a cathode compartment at the center and a pair of anode compartments on both sides of the cathode compartment;
  (b) a pair of hydrogen-ion exchange membranes each partitioning the cathode compartment and one of the anode compartments;
  (c) a pair of cathode plates each bonded to one of the ion exchange membranes on the surface facing the cathode compartment; and
  (d) a pair of anode plates each bonded to one of the ion exchange membranes on the surface facing the anode compartment at such a position approximately to oppose to the cathode plate, which method comprises the steps of:
    (A) holding a semiconductor wafer in the cathode compartment in a substantially vertical disposition;
    (B) introducing pure water continuously into each of the cathode compartment and anode compartments at the bottom thereof;
    (C) discharging the pure water continuously from each of the cathode compartment and anode compartments at the top thereof; and
    (D) applying a direct-current voltage between the cathode plates and the anode plates.

13. The method for the cleaning treatment of a semiconductor wafer as claimed in claim 12 in which ultrasonic waves are applied to the pure water in the cathode compartment.

14. The method for the cleaning treatment of a semiconductor wafer as claimed in claim 13 in which the frequency of the ultrasonic waves is in the range from 500 kHz to 3 MHz.

15. A method for the cleaning treatment of a semiconductor wafer in an apparatus comprising:
  (a) a rectangular or square vessel for containing an aqueous medium for cleaning of a semiconductor wafer by holding the semiconductor wafer in a workpiece holder in a substantially vertical disposition in a center part thereof, said vessel being partitioned in the lengthwise direction into a cathode compartment at the center and a pair of anode compartments on both sides of the cathode compartment;
  (b) a pair of partitions each partitioning the cathode compartment and one of the anode compartments, each partition being formed of a pair of hydrogen-ion exchange membranes, one facing the cathode compartment and the other facing the anode compartment, to form a flow passage therebetween;

(c) a pair of cathode plates each bonded to one of the ion exchange membranes on the surface facing the cathode compartment;

(d) a pair of anode plates each bonded to one of the ion exchange membranes on the surface facing the anode compartment at such a position approximately to oppose to the cathode plate; and (e) a pair of hydroxyl ion-permeable membranes each forming a sub-compartment between the cathode compartment and one of the cathode plate, which method comprises the steps of:

(A) holding a semiconductor wafer in the cathode compartment in a substantially vertical disposition;

(B) introducing pure water continuously into each of the cathode compartment, anode compartments and flow passages at the bottom thereof;

(C) discharging the pure water continuously from each of the cathode compartment, anode compartments and flow passages at the top thereof;

(D) introducing an aqueous solution of an electrolyte continuously into each of the sub-compartments at the bottom thereof;

(E) discharging the aqueous solution of an electrolyte continuously from the sub-compartment at the top thereof; and (F) applying a direct-current voltage between the cathode plates and the anode plates.

16. The method for the cleaning treatment of a semiconductor wafer as claimed in claim 15 in which ultrasonic waves are applied to the pure water in the cathode compartment.

17. The method for the cleaning treatment of a semiconductor wafer as claimed in claim 16 in which the frequency of the ultrasonic waves is in the range from 500 kHz to 3 MHz.

18. The method for the cleaning treatment of a semiconductor wafer as claimed in claim 15 in which the electrolyte is an alkaline compound or a neutral salt free from halogen.

19. The method for the cleaning treatment of a semiconductor wafer as claimed in claim 15 in which the concentration of the electrolyte in the aqueous solution does not exceed 1% by weight.

* * * * *